United States Patent
Takijiri et al.

(10) Patent No.: US 11,906,984 B2
(45) Date of Patent: Feb. 20, 2024

(54) CONCENTRATION CONTROL SYSTEM, CONCENTRATION CONTROL METHOD AND PROGRAM FOR A CONCENTRATION CONTROL SYSTEM

(71) Applicant: HORIBA STEC, Co., Ltd., Kyoto (JP)

(72) Inventors: Kotaro Takijiri, Kyoto (JP); Ojiro Takamune, Kyoto (JP)

(73) Assignee: HORIBA STEC, Co., Ltd., Kyoto (JP)

(*) Notice: Subject to any disclaimer, the term of this patent is extended or adjusted under 35 U.S.C. 154(b) by 343 days.

(21) Appl. No.: 17/454,608

(22) Filed: Nov. 11, 2021

(65) Prior Publication Data
US 2022/0147072 A1    May 12, 2022

(30) Foreign Application Priority Data
Nov. 11, 2020  (JP) .................. 2020-188058

(51) Int. Cl.
*G05D 11/13* (2006.01)
*G05B 17/02* (2006.01)
(Continued)

(52) U.S. Cl.
CPC ........ *G05D 11/138* (2013.01); *C23C 16/4401* (2013.01); *C23C 16/448* (2013.01);
(Continued)

(58) Field of Classification Search
CPC .............. C23C 16/4408; C23C 16/448; C23C 16/4485; C23C 16/45527; C23C 16/45561; C23C 16/45574; C23C 16/52; F02D 41/0002; F02D 41/0052; G03F 7/70025; G03F 7/7055; H01L 21/31; H01L 21/324; H01L 21/67017; H01L 21/67115; H01L 21/67248; H01L 21/67253; H01L 21/67288; H01L 21/68707; H01L 21/6875;
(Continued)

(56) References Cited

U.S. PATENT DOCUMENTS 11,081,409 B2 *  8/2021  Omori ............... H01L 21/67017
2012/0006487 A1  1/2012  Kikuchi et al.

FOREIGN PATENT DOCUMENTS

JP    3762062 B2 *  3/2006
JP    3805840 B2 *  8/2006  .......... F02D 41/0052
(Continued)

*Primary Examiner* — Crystal J Barnes-Bullock
(74) *Attorney, Agent, or Firm* — Alleman Hall & Tuttle LLP

(57) ABSTRACT

Provided is a concentration control system that has only a small time delay, obtains accurate estimated values, and also enables partial pressure control having improved responsiveness and accuracy. The system includes a flow rate control device provided on a supply flow path that supplies gas to a chamber, and controls a flow rate of a gas in the supply flow path to match a set flow rate, a partial pressure measurement device for a gas inside the chamber, an observer having a model which estimates a state of the gas inside the chamber, where a flow rate of the gas flowing into the chamber and measured partial pressures are input into the model, and an estimated partial pressure of the gas within the chamber is output, and a controller that, based on a set partial pressure and on the estimated partial pressure, sets the set flow rate.

8 Claims, 7 Drawing Sheets

(51) Int. Cl.
 *G01N 21/3504* (2014.01)
 *C23C 16/44* (2006.01)
 *C23C 16/448* (2006.01)

(52) U.S. Cl.
 CPC ..... *C23C 16/4408* (2013.01); *G01N 21/3504* (2013.01); *G05B 17/02* (2013.01); *G05D 11/132* (2013.01); *G05D 11/135* (2013.01)

(58) Field of Classification Search
 CPC ..... H01L 22/26; H01S 3/036; H01S 3/08004; H01S 3/08009; H01S 3/09702; H01S 3/0971; H01S 3/10069; H01S 3/104; H01S 3/1306; H01S 3/134; H01S 3/225; H01S 3/2251; H01S 3/2256; G05D 7/06; G05D 11/132; G05D 11/135; G05D 11/138; G05D 21/02; G05B 17/02; G01N 21/3504; G01N 21/359
 See application file for complete search history.

(56) References Cited

FOREIGN PATENT DOCUMENTS

| | | | | |
|---|---|---|---|---|
| JP | 4339321 B2 | * | 10/2009 | ......... F02D 41/0002 |
| JP | 7252214 B2 | * | 4/2023 | ......... G03F 7/70025 |
| KR | 101567357 B1 | * | 11/2015 | ........... C23C 16/448 |
| WO | WO-2006081023 A2 | * | 8/2006 | ....... C23C 16/45527 |
| WO | 2010113576 A1 | | 10/2010 | |

\* cited by examiner

PRESENT EMBODIMENT

CONVENTIONAL TECHNOLOGY
(FILTERING IS PERFORMED AFTER ANTIDERIVATIVE IS INSERTED INTO OUTPUT)

CONCENTRATION CONTROL SYSTEM, CONCENTRATION CONTROL METHOD AND PROGRAM FOR A CONCENTRATION CONTROL SYSTEM

TECHNICAL FIELD

The present invention relates to a concentration control system that is used to control partial pressures of gases inside a chamber.

TECHNICAL BACKGROUND

In a semiconductor manufacturing process, a gas mixture obtained by mixing, for example, a material gas with a carrier gas is supplied at a predetermined concentration to a processing chamber. A mass flow controller, which is a flow rate control device that controls flow rates of the respective gases, is provided on a supply flow path that has a plurality of branch paths that are connected to the processing chamber, and the flow rate of each gas is controlled so that a predetermined concentration is obtained.

More specifically, as is shown in Patent Document 1, the concentration of the material gas in the gas mixture, in other words, the partial pressure of the material gas is measured by an absorption spectrometer such as an NDIR (Non-Dispersive Infrared) analyzer or the like that is provided, for example, on a supply flow path located on an upstream side from the processing chamber. The partial pressure of the material gas that was measured by the absorption spectrometer is fed back into the loop and, based on any deviation between the measurement partial pressure and a set partial pressure that is the desired target, a set flow rate that is set in a flow rate control device of each gas is appropriately altered.

In the above-described concentration control system, because the partial pressure of the gas is measured before the gas enters the chamber, if any adsorption or the like of the gas within the flow path occurs, then a deviation is generated between the measured partial pressure and the actual partial pressure within the chamber. Accordingly, if the partial pressure is measured inside the supply flow path, then it is not possible to be certain that the actual partial pressure of the gas within the chamber is being maintained at the set partial pressure. In order to solve this type of problem, a method of more precisely controlling the partial pressure by providing an NDIR analyzer in the chamber so that the concentration of the gas within the chamber is measured directly may be considered.

However, NDIR has drawbacks in that a considerable delay is generated relative to the actual partial pressure, and in that considerable noise is also generated. Because of this, even if the interior of the chamber is measured directly using an NDIR analyzer, it is still not possible to rapidly and accurately ascertain any changes in the actual partial pressure. Accordingly, even if a concentration control system such as that described above is constructed, it is still difficult to achieve partial pressure control at a satisfactory response speed and level of accuracy.

DOCUMENTS OF THE PRIOR ART

Patent Documents

Patent Document 1 International Patent Publication No. 2010/113576

DISCLOSURE OF THE INVENTION

Problems to be Solved by the Invention

The present invention was conceived in consideration of the above-described problems, and it is an object thereof to provide a concentration control system that has only a small time delay in relation to an actual partial pressure of a gas inside a chamber, and enables accurate estimated values to be obtained, and also enables partial pressure control having improved responsiveness and accuracy compared to the conventional technology to be achieved.

Means for Solving the Problem

In other words, a concentration control system according to the present invention is characterized in being provided with a flow rate control device that is provided on a supply flow path that supplies gas to an interior of a chamber, and performs control such that a flow rate of a gas flowing through this supply flow path matches a set flow rate that has been input, a partial pressure measurement device that measures a partial pressure of a gas inside the chamber, an observer that is equipped with a model which estimates a state of the gas inside the chamber, and that is formed such that an inflow flow rate of a gas flowing into the chamber and measurement partial pressures from the partial pressure measurement device are input into the model, and an estimated partial pressure of the gas within the chamber is output, and a controller that, based on a set partial pressure and on the estimated partial pressure of the gas within the chamber output by the observer, sets the set flow rate in the flow rate control device.

A concentration control method according to the present invention is characterized in utilizing a concentration control system that includes a flow rate control device that is provided on a supply flow path that supplies gas to an interior of a chamber, and performs control such that a flow rate of a gas flowing through the supply flow path matches a set flow rate that has been input, and a partial pressure measurement device that measures a partial pressure of a gas inside the chamber, in which an inflow flow rate of a gas flowing into the chamber and a measurement partial pressure from the partial pressure measurement device are input into a model which estimates a state of the gas inside the chamber, and an estimated partial pressure of the gas within the chamber is estimated, and in which, based on a set partial pressure and on the estimated partial pressure of the gas within the chamber output by the observer, the set flow rate is set in the flow rate control device.

According to this concentration control system, because the observer outputs an estimated partial pressure of a gas inside the chamber based on the model, it is possible to perform control in which the delay relative to the actual partial pressure inside the chamber is smaller and in which the noise value is also smaller compared to a measurement partial pressure output by the partial pressure measurement device. Moreover, because not only the inflow flow rate of a gas flowing into the chamber, but also the measurement partial pressure from the partial pressure measurement device are input into the observer, any deviation from the initial state of the partial pressure or offset of the partial pressure or the like is also corrected so that correct values are obtained. Moreover, because the controller sets the set flow rate in the flow rate control device based on the estimated partial pressure from the observer, it is possible to achieve concentration control having superior responsiveness compared to a case in which a measurement partial pressure is used.

In order to enable the model to more accurately reflect a state within the chamber based on a simple numerical formula, it is desirable that the model simulate a conductance of an exhaust flow path that expels gas from within the chamber, and that the conductance be set to a constant value.

In order to increase the modeling accuracy of the observer even after the conductance has been set to a constant value, it is desirable that an exhaust valve whose valve opening is able to be controlled be provided on the exhaust flow path, and that the exhaust valve be fixed at a predetermined valve opening.

Even in a case in which, due, for example, to an external disturbance, a steady-state deviation is generated in the actual partial pressure of the gas inside the chamber, in order to enable the value thereof to be reflected in the estimated partial pressure, it is desirable that the estimated partial pressure be a column vector formed by a first estimated partial pressure obtained by estimating the actual partial pressure, and a second estimated partial pressure obtained by estimating the measurement partial pressure from the partial pressure measurement device, and that the observer be further equipped with an observer gain H which is a row vector whose elements are h1 and h2, with the element h2 being set to the same value as the conductance. By employing this type of structure, because the conductance is the pole that is to be the subject of control, any steady-state deviation in the first estimated partial pressure is fully reflected by the pole placement.

If the partial pressure measurement device is an NDIR analyzer, and the model simulates the delay in the measurement partial pressure output by the NDIR analyzer relative to the actual partial pressure as a first order delay, then partial pressure control can be performed at a value that is close to the actual partial pressure inside the chamber, which is not actually unobservable.

In order to make it possible to achieve control having superior responsiveness compared with a case in which deviations between the measurement partial pressure output by the partial pressure measurement device and the set partial pressure are integrated, it is desirable that the estimated partial pressure be a row vector formed by a first estimated partial pressure obtained by estimating the actual partial pressure, and a second estimated partial pressure obtained by estimating the measurement partial pressure from the partial pressure measurement device, and that the controller be formed such that deviations between the set partial pressure and the first estimated partial pressure are integrated. If this type of structure is employed, then because changes in the unobservable actual partial pressure of a gas inside the chamber are able to be fed back without any time delay, it is possible to improve the responsiveness compared with a case in which measurement partial pressures are fed back.

In order to make it possible in an existing concentration control system to demonstrate substantially equivalent effects as those obtained from the concentration control system according to the present invention by, for example, updating a program, it is desirable to use a program for a concentration control system that includes a flow rate control device that is provided on a supply flow path that supplies gas to an interior of a chamber, and performs control such that a flow rate of a gas flowing through this supply flow path matches a set flow rate that has been input, and a partial pressure measurement device that measures a partial pressure of a gas inside the chamber, and that is characterized in causing a computer to demonstrate functions of an observer that is equipped with a model which estimates a state of the gas within the chamber, and that is formed such that an inflow flow rate of a gas flowing into the chamber and a measurement partial pressure from the partial pressure measurement device are input into the model, and an estimated partial pressure of the gas within the chamber is output, and of a controller that, based on a set partial pressure and on the estimated partial pressure of the gas within the chamber output by the observer, sets the set flow rate in the flow rate control device.

Note that the program for a concentration control system may be delivered electronically, or may be recorded on a program recording medium such as a CD, DVD, or flash memory or the like.

Effects of the Invention

In this way, according to the concentration control system according to the present invention, because the observer estimates a partial pressure of a gas inside the chamber as an estimated partial pressure based on the model, it is possible to obtain smaller values for the noise and time delay compared with a measurement partial pressure output by the partial pressure measurement device. Accordingly, it becomes possible to perform control in which actual concentration changes inside the chamber are reflected immediately, and to improve the responsiveness and accuracy of the control compared to the conventional technology.

BEST EMBODIMENTS FOR IMPLEMENTING THE INVENTION

A concentration control system 100 according to an embodiment of the present invention will now be described with reference to the respective drawings. The concentration control system 100 of the present embodiment controls partial pressures of gases within a processing chamber where, for example, plasma processing is performed on substrates in a semiconductor manufacturing process. As is shown in FIG. 1, a supply flow path SL that supplies various types of gases to an interior of a chamber CN, and an exhaust flow path EL that discharges gases within the chamber CN to the outside are connected respectively to the chamber CN.

The supply flow path SL is formed by a plurality of parallel branch flow paths DL1 and DL2 whose respective upstream sides are connected to individual sources of various types of gas, and a post-convergence flow path CL that is formed by the respective branch flow paths DL1 and DL2 converging into a single flow path, and that is connected to the chamber CN. In the present exemplary embodiment, the first branch flow path DL1 is connected to a supply source for $N_2$, which is a dilution gas, and the second branch flow path DL2 is connected to a supply source for $CF_4$, which is a processing gas. Note that the types of gases described above that are supplied to the supply flow path SL are merely examples thereof, and it is also possible for other types of gases to be used.

An upstream side of the exhaust flow path EL is connected to the chamber CN, while a downstream side thereof is connected to a vacuum pump VP. An exhaust valve VP that controls the conductance of the exhaust flow path EL is provided on the exhaust path EL. The exhaust valve EV is formed such that a valve opening thereof can be controlled to an optional value between 0% and 100%.

Figure 1:
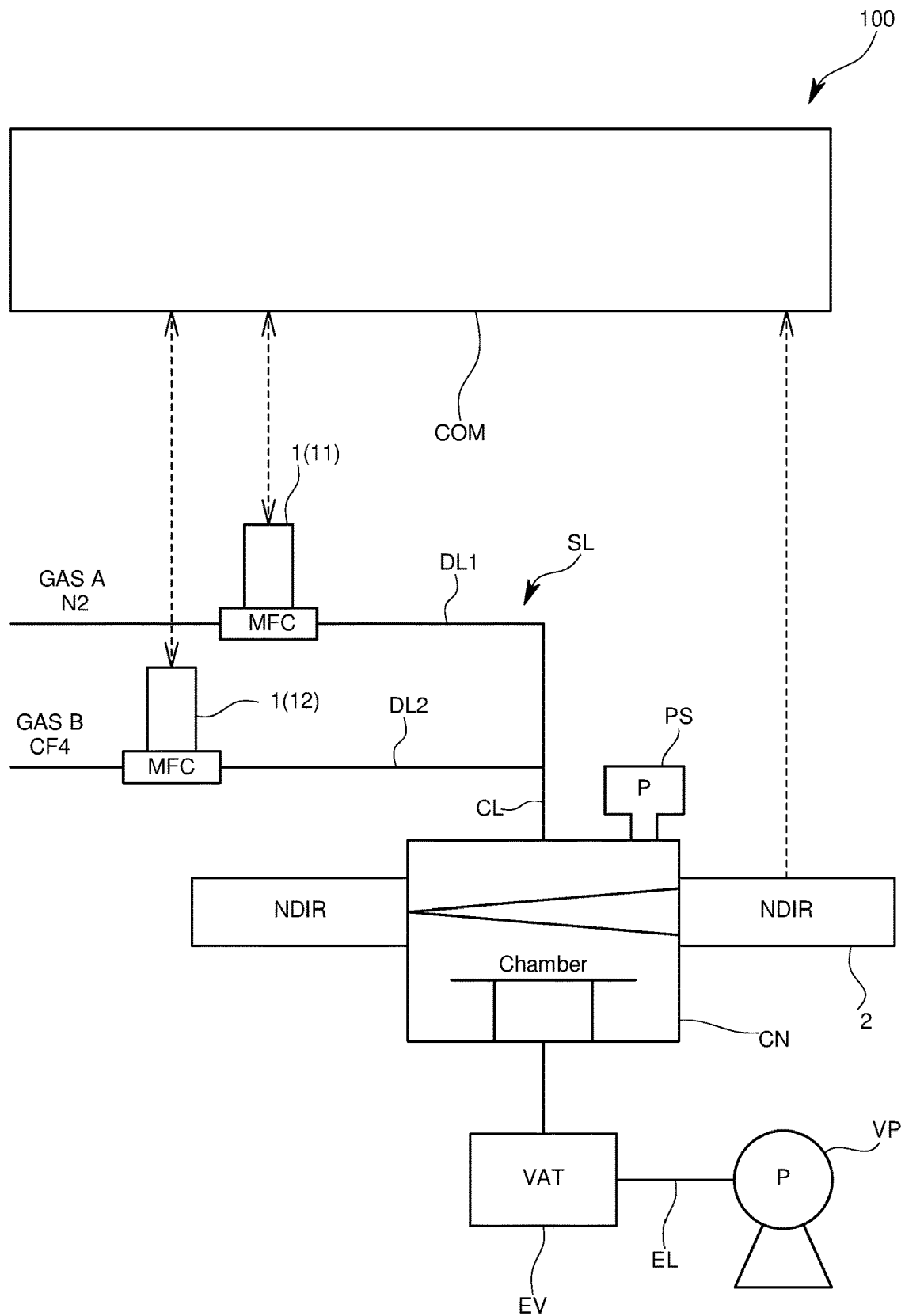
FIG. 1 is a schematic view showing a concentration control system according to an embodiment of the present invention.

As is shown in FIG. 1, the concentration control system 100 of the present embodiment is provided with two flow rate control devices 1 that are provided respectively on the first branch flow path DL1 and on the second branch flow path DL2, a partial pressure measurement device 2 that is provided in the chamber CN and measures the partial pressure of the $CF_4$ gas within the chamber CN, a pressure sensor that is provided in the chamber CN and measures the total pressure within the chamber CN, and a control calculation device COM that controls the respective flow rate control devices 1 and the exhaust gas valve EV, and also executes various types of calculations. In this way, the concentration control system 100 is formed so as to estimate an actual partial pressure of the $CF_4$ gas within the chamber CN, which has not hitherto been observable, using an observer 3 that is realized by the calculation functions of the control calculation device COM, and so as to then alter the set flow rate in each flow rate control device 1 based on the estimated partial pressure and on a set partial pressure that is set by a user.

Each portion will now be described in detail.

Each flow rate control device 1 is what is known as a 'mass flow controller', and is formed by packaging a flow rate sensor, a valve, and a control board, which are all instruments necessary for performing flow rate control, into a single unit. The control board controls the openings of the valves such that any deviation between the measurement flow rate measured by the flow rate sensor and the set flow rate set from an external unit is reduced. In other words, a single flow rate feedback loop is formed by a single flow rate control device 1. In the present embodiment, each flow rate control device 1 receives set flow rates that are output by the control calculation unit COM, and is operated such that the flow rates of the gas flowing through the respective branch flow rates DL1 and DL2 are maintained at the set flow rates. The first flow rate control device 11, which is provided on the first branch flow path DL1, is formed so as to control the flow rate of the $N_2$ gas, while the second flow rate control device 12, which is provided on the second branch flow path DL2, is formed so as to control the flow rate of the $CF_4$ gas. Various sensors such as a thermal flow rate sensor or a pressure flow rate sensor can be used for the flow rate sensor, while various valves such as a piezo valve or a solenoid valve can be used for the valve. Moreover, it is also possible to construct each flow rate control device 1 using a variable orifice instead of a valve.

The partial pressure measurement device 2 is what is known as an NDIR (Non-Dispersive Infrared) analyzer that measures the partial pressure of the $CF_4$ gas within the chamber CN based on light absorbance. The partial pressure measurement device 2 is provided with a light source that irradiates infrared light into the interior of the chamber CN, a photodetector that detects infrared light that has passed through the interior of the chamber CN, and a partial pressure calculator (not shown in the drawings) that calculates the light absorbance of the $CF_4$ gas within the chamber CN based on outputs from the photodetector, and the partial pressure of the $CF_4$ gas within the chamber CN from the total pressure inside the chamber CN obtained from a pressure sensor. Note that, here, the partial pressure calculator is formed using, for example, the calculation functions of the control calculation device COM, however, it is also possible for the functions thereof to be realized by using a dedicated computing board. An existing algorithm may be used for the algorithm used by the partial pressure calculator to calculate the partial pressure of the $CF_4$ gas. In the following description, the partial pressure of the $CF_4$ gas output as a measurement value by the partial pressure measurement device 2 is also referred to as a measurement partial pressure in order to differentiate it from estimated values output by the observer 3. The measurement partial pressure output from the partial pressure measurement device 2 is formed by superimposing a predetermined amount of time delay and, for example, electrical noise and the like onto the actual partial pressure of the actual $CF_4$ gas within the chamber CN.

Figure 2:
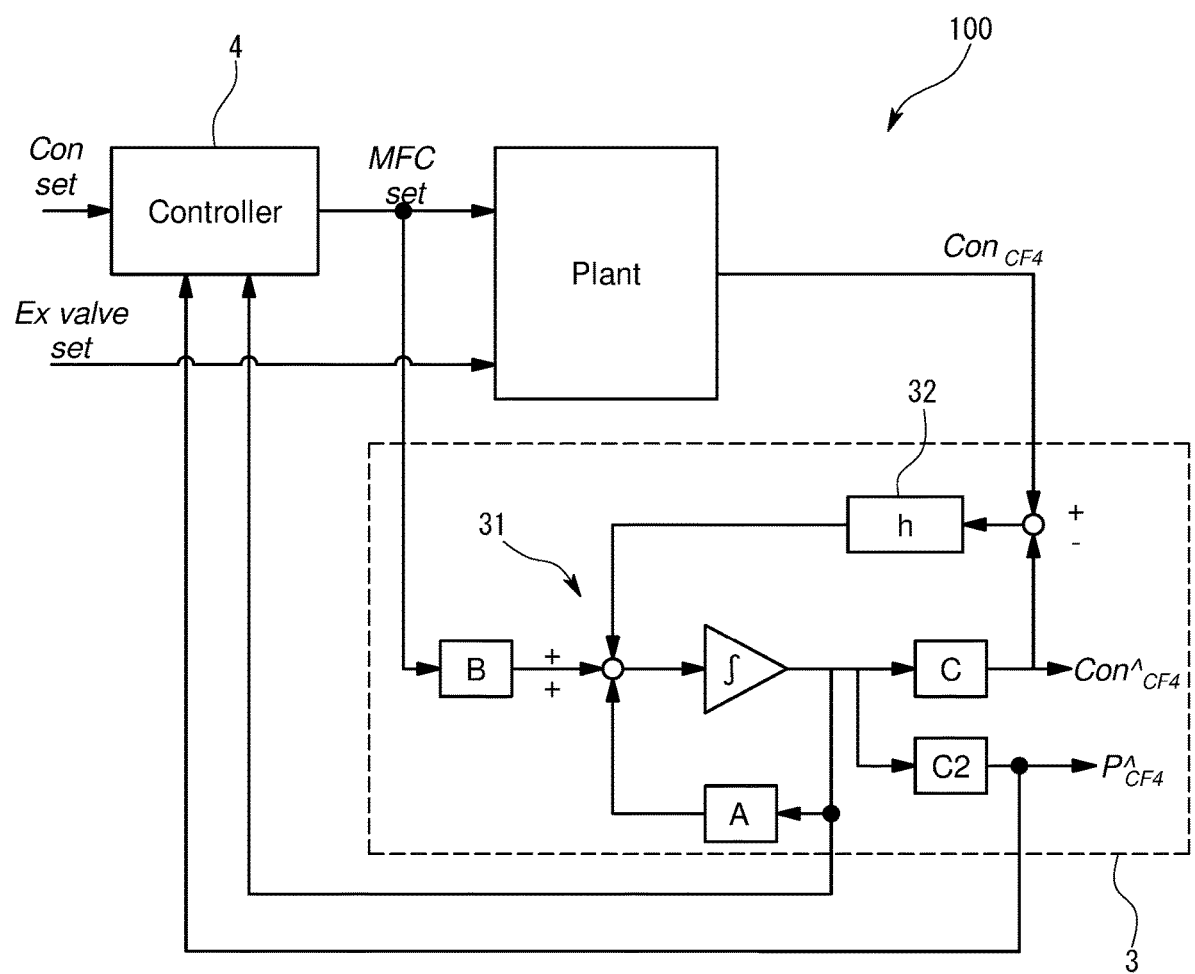
FIG. 2 is a schematic view showing state feedback that utilizes an observer of the concentration control system of the same embodiment.

As is shown in FIG. 2, the control calculation device COM functions as the observer 3 that simulates states of the partial pressure of the $CF_4$ gas within the chamber CN, which is the control subject, based on a model 31, and outputs these partial pressure states as estimated partial pressures, and as a controller 4 that controls the flow rate control devices 1 based on set partial pressures set by a user and on the estimated partial pressures output from the observer 3. More specifically, the control calculation device COM is provided with a CPU, memory, an A/D converter, a D/A converter, and various types of input and output devices. The functions of the above-described observer 3 and controller 4 are realized as a result of a program for the concentration control system 100 that is stored in the memory being executed and causing various instruments to operate in mutual collaboration.

The observer 3 is formed so as to simulate physical characteristics relating to the partial pressure of the $CF_4$ gas within the chamber CN of the Plant shown in FIG. 2, and to output an estimated partial pressure for the $CF_4$ gas within the chamber CN. More specifically, as is shown in the block line drawing in FIG. 3, the observer 3 is equipped with the model 31 that is expressed by the same equation of state as the equation of state of the Plant in FIG. 2, which is the control subject, and with an observer gain 32. In the following description, the estimated partial pressure output by the observer 3 is also referred to as an estimated partial pressure.

Figure 3:
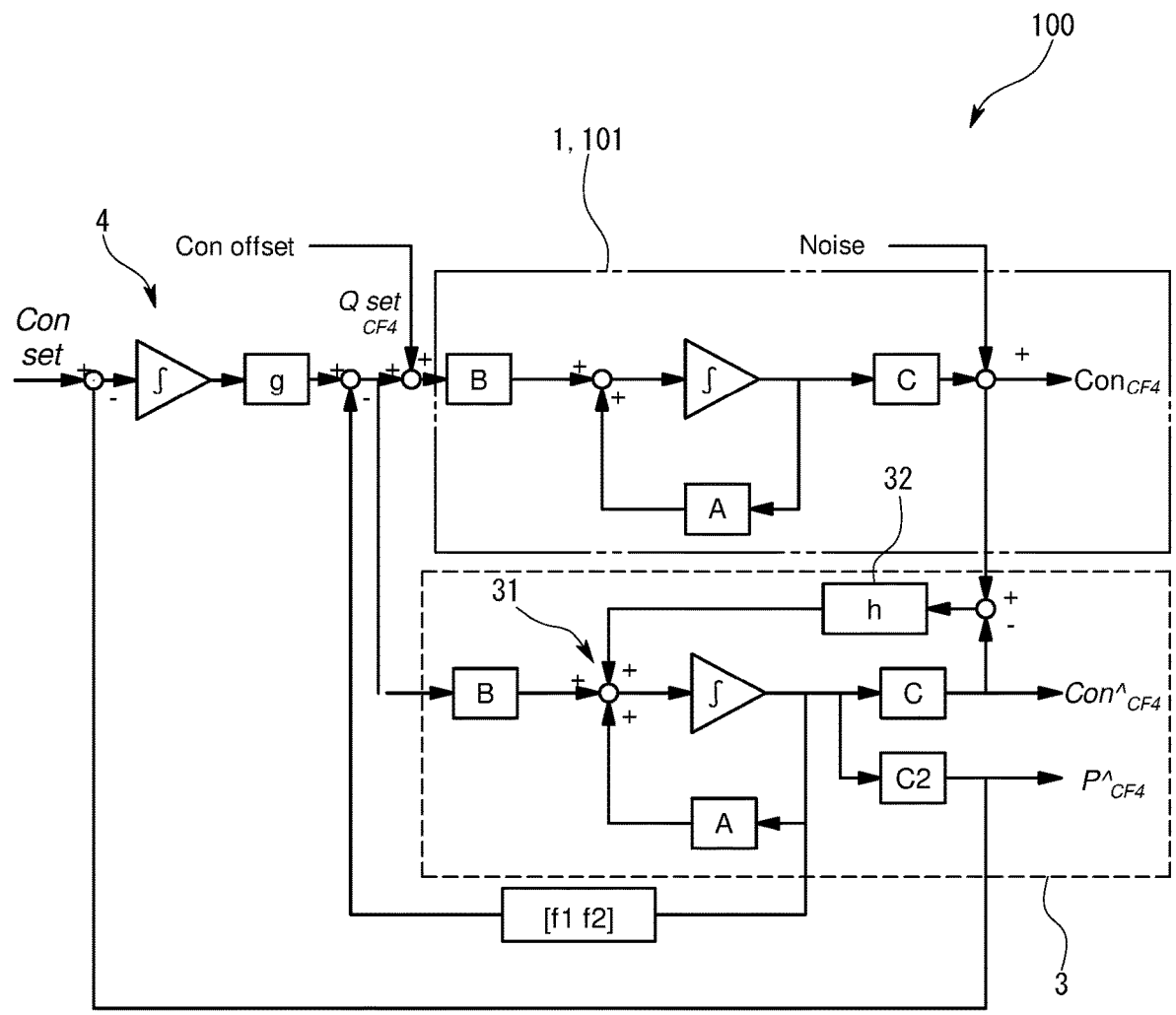
FIG. 3 is a block line drawing showing state feedback that utilizes the observer of the concentration control system of the same embodiment.

As is shown in FIG. 3, the inflow flow rate of the $CF_4$ gas flowing into the chamber CN, and the measurement partial pressure from the partial pressure measurement device 2 are input into the model 31. Here, the set flow rate input into the second flow rate control device 12 is used for the inflow flow rate of the $CF_4$ gas. Note that it is also possible for the flow rate actually measured by the flow rate sensor of the second flow rate control device 12 to be used as the inflow flow rate. In accordance with these inputs, the model 31 outputs as the estimated partial pressure a first estimated partial pressure obtained by estimating the actual partial pressure of the $CF_4$ gas within the chamber CN, and a second estimated partial pressure obtained by estimating the measurement partial pressure from the partial pressure measurement device 2.

The equations of state of the model 31 will now be described in detail. Note that the physical model is based on the model shown in FIG. 1.

A total pressure P inside the chamber CN can be described in the manner shown below from a flow rate $Q_{total}$ flowing into the chamber CN through the supply flow path S, a flow rate $Q_{vacuum}$ flowing out from the chamber CN via the exhaust flow path EL, and an equation of state of the gas relative to the volume V of the chamber CN.

$$P = 1/V \int (Q_{total} - Q_{vaccum}) dt \quad (A)$$

Moreover, if the conductance of the exhaust valve EV is taken as a constant value Cv, then $$Q_{vaccum} = CV * P \quad (B)$$

Figure 4:
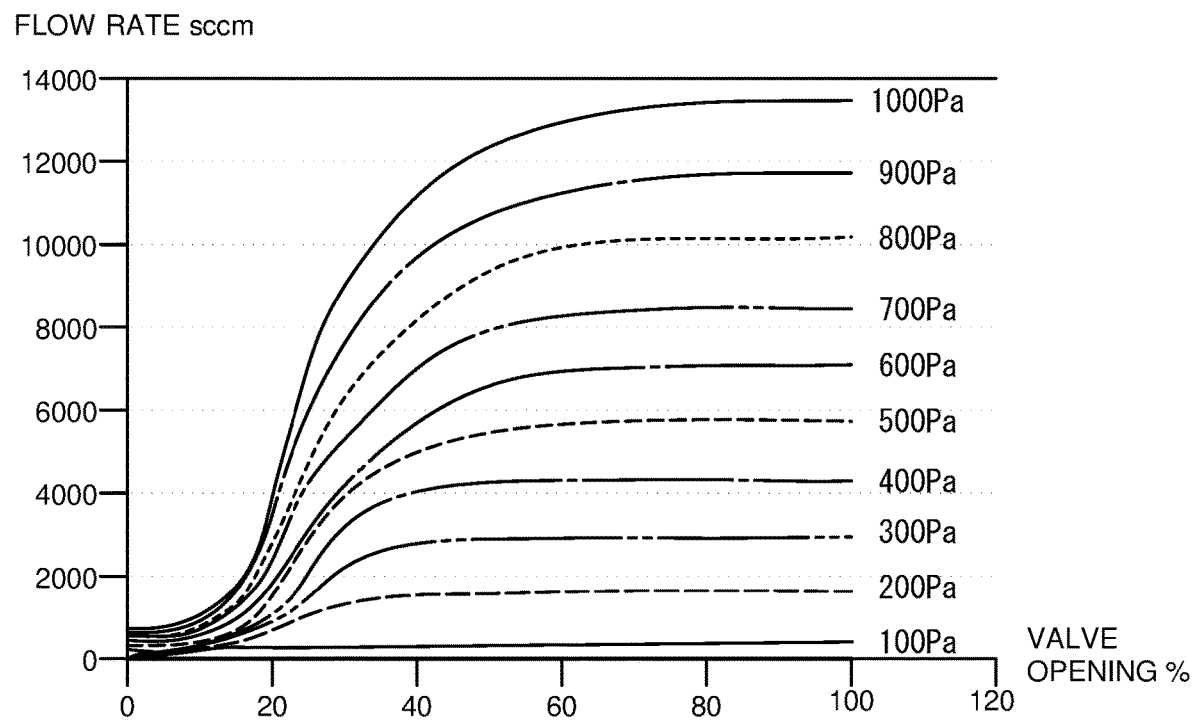
FIG. 4 is a graph showing changes in conductance at each chamber pressure in an exhaust valve of the same embodiment.

Note that, as is shown in the graph in FIG. 4, the conductance of the exhaust valve EV includes a transition area where the effect from the total pressure P within the chamber CN is considerable such as an area where the valve opening of the exhaust valve EV is between 20% and 60%, and a constant conductance area where the valve opening is 15% or less and the conductance remains as a substantially constant value irrespective of the value of the total pressure P. In this concentration control system 100, the control calculation device COM maintains the valve opening of the exhaust valve EV in the constant conductance area of, for example, 15% or less, and establishes conditions that substantially prevent the conductance from being affected by the total pressure P, and enable modeling to be performed with the conductance being taken as a constant value.

In addition, if a Laplace transform is performed on the above Formula (A) so as to substitute the above Formula (B), then $$V * P * s = Q_{total} - Cv * P \quad (C)$$

and if a formula deformation is performed on Formula (C), then $$P = Q_{total}/(V*s + Cv) \quad (D)$$

Moreover, if a flow rate of the $N_2$ gas flowing into the chamber CN is taken as $Q_{N2}$, and a flow rate of the $CF_4$ gas flowing into the chamber CN is taken as $Q_{CF4}$, then, $$Q_{total} = Q_{N2} + Q_{CF4} \quad (E)$$

A transfer function of the partial pressure of the $CF_4$ gas within the chamber CN from the above Formula (D) and Formula (F) is as follows $$P_{CF4}(s) = Q_{CF4}/(V*s + Cv) \quad (F)$$

Furthermore, because a first order delay of a time constant T relative to the actual partial pressure $P_{CF4}(s)$ is contained in the measurement partial pressure $Con_{CF4}(s)$ of the NDIR analyzer, which is serving as the partial pressure measurement device 2, $$Con_{CF4}(s) = P_{CF4}(s)/(T*s + 1) \quad (G)$$

Based on the above Formula (F) and Formula (G), in FIG. 3, an equation of state relating to the partial pressure inside the chamber CN which is expressed using A, B, and C is shown in the following Equation 1.

$$\begin{bmatrix} \dot{P}_{CF4} \\ \dot{Con}_{CF4} \end{bmatrix} = \begin{bmatrix} -Cv/V & 0 \\ 1/T & -1/T \end{bmatrix} \begin{bmatrix} P_{CF4} \\ CON_{CF4} \end{bmatrix} + \begin{bmatrix} Cv/V \\ 0 \end{bmatrix} Q_{CF4} \quad \text{Equation 1}$$

$$Con_{CF4+Noise} = [0 \ 1] \begin{bmatrix} P_{CF4} \\ CON_{CF4} \end{bmatrix} + \text{Noise}$$

Accordingly, the matrices A, B, and C that determine the equation of state are shown in the following Equation 2.

$$A = \begin{bmatrix} -Cv/V & 0 \\ 1/T & -1/T \end{bmatrix} B = \begin{bmatrix} Cv/V \\ 0 \end{bmatrix} C = [0 \ 1] \quad \text{Equation 2}$$

Figure 5:
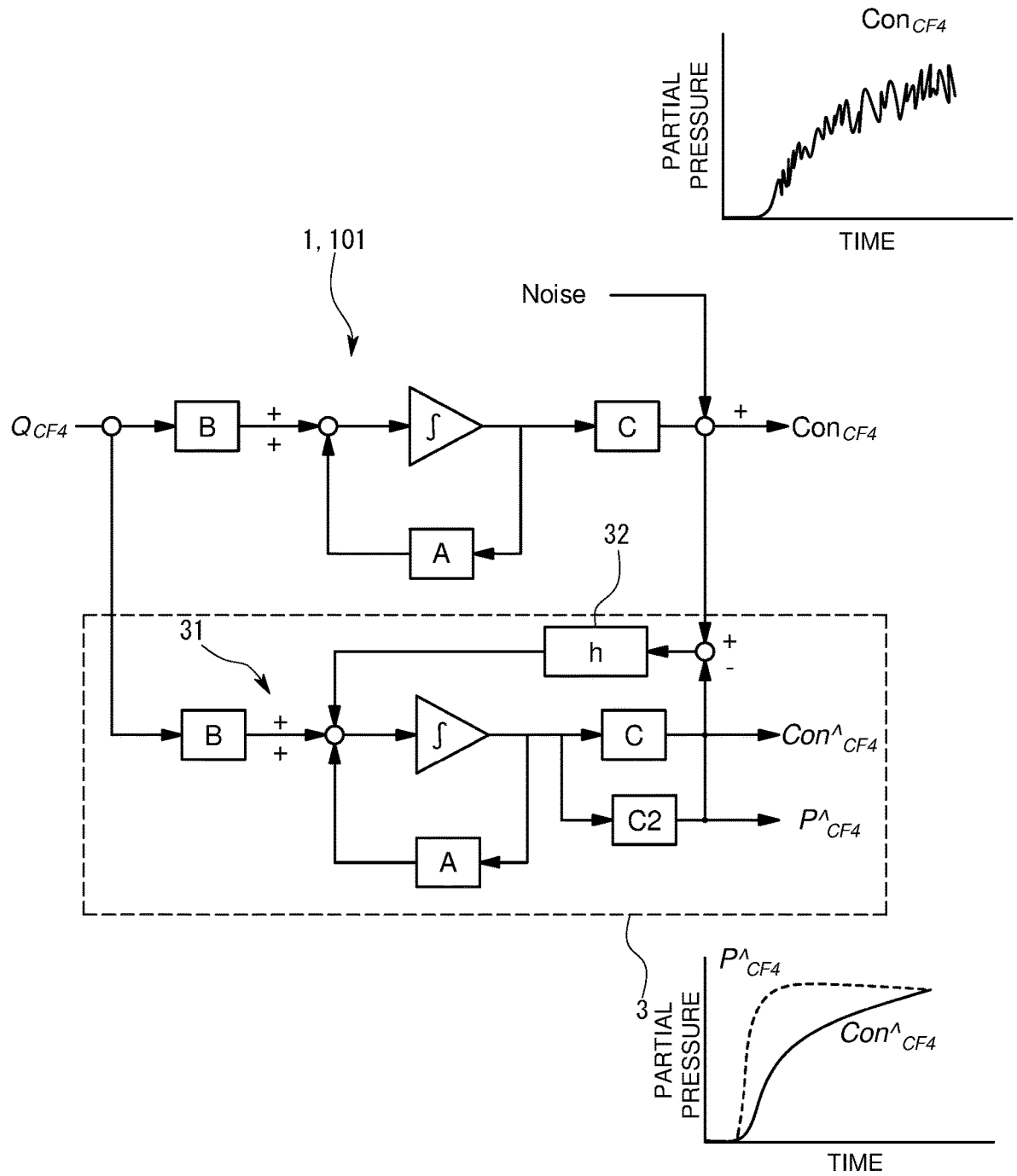
FIG. 5 contains a block line drawing and output graphs showing details of the observer of the same embodiment.

As is shown in FIG. 5, the model 31 of the observer 3 is expressed by an equation of state using the common matrices A, B, and C so that the same physical model is used for the control subject and the observer 3. Hereinafter, the partial pressure from the partial pressure measurement device 2 is described as $Con_{CF4}$, and the first estimated partial pressure and second estimated partial pressure output by the observer 3 are described as $\hat{P}_{CF4}$ and $\hat{Con}_{CF4}$ respectively.

As is shown in the graph in FIG. 4, a time delay and electrical noise are generated in the measurement partial pressure $Con_{CF4}$ output from the partial pressure measurement device 2, however, no electrical noise is superimposed on the estimated partial pressure estimated by the observer 3. Moreover, because the first estimated partial pressure is obtained by estimating the actual partial pressure of the $CF_4$ gas within the chamber CN, which it is not possible to observe, a value is output for this first estimated partial pressure from which any time delay has been eliminated.

Figure 6:
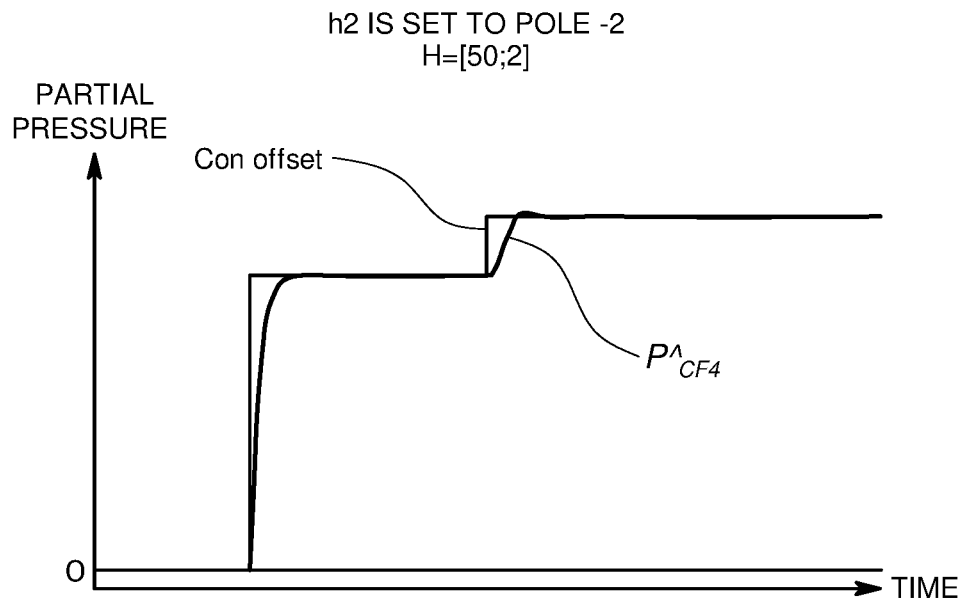
FIG. 6 shows an example of an estimation of a partial pressure of a gas within a chamber estimated by the observer of the same embodiment.

Next, the observer gain h=[h1; h2] will be described. The observer gain 32 is a value that is multiplied by the deviation between the measurement partial pressure and the second estimated partial pressure, and is fed back into the model 31. The observer gain 32 is designed by pole placement. The h2 of the observer gain 32 is set such that an actual output constant offset Con offset of the control subject shown in FIG. 3 is also reflected in the output of the first estimated partial pressure $\hat{P}_{CF4}$. More specifically, because a conductance Cv of the exhaust valve EV forms a pole of the control subject, h2 is set to the pole Cv. For example, in a case in which Cv=2, a simulation result of an estimated partial pressure in a case in which h1=50 is shown in FIG. 6. It can be seen from FIG. 6 that, even if there is an actual output constant offset of the control subject, the first estimated partial pressure from the observer 3 is able to reflect this offset. Note that a value that is larger than zero, and is as large as possible is set for the value of h1.

Lastly, the structure of the controller 4 will be described.

As is shown in the block line drawing in FIG. 3, in the present embodiment, the controller 4 is formed such that an integration operation is not performed on the deviation between the set partial pressure which has been set by a user, and the measurement partial pressure from the partial pressure measurement device 2, but such that an integration operation is performed on the deviation between the set partial pressure and the first estimated partial pressure $\hat{P}_{CF4}$. In other words, feedback is applied such that the first estimated partial pressure follows the set partial pressure. The poles [f1; f2; −g] are designed such that a desired response is obtained using the pole placement obtained from a state space representation. More specifically, the observer control in a case in which V=10, Cv=1, and T=0.5 is described as an equation of state such as that shown in the following Equation 3.

$$\begin{bmatrix} \dot{\hat{P}}_{CF4} \\ \dot{\widehat{Con}}_{CF4} \\ \dot{z} \end{bmatrix} = \begin{bmatrix} -1/10 & 0 & 0 \\ 1/0.5 & -1/0.5 & 0 \\ -1 & 0 & 0 \end{bmatrix} \begin{bmatrix} \hat{P}_{CF4} \\ \widehat{Con}_{CF4} \\ z \end{bmatrix} + \begin{bmatrix} 10 \\ 0 \\ 0 \end{bmatrix} Q_{CF4} \quad \text{Equation 3}$$

$$Q_{CF4} = -[f1 \; f2 \; -g] \begin{bmatrix} \hat{P}_{CF4} \\ \widehat{Con}_{CF4} \\ z \end{bmatrix}$$

Figure 7:
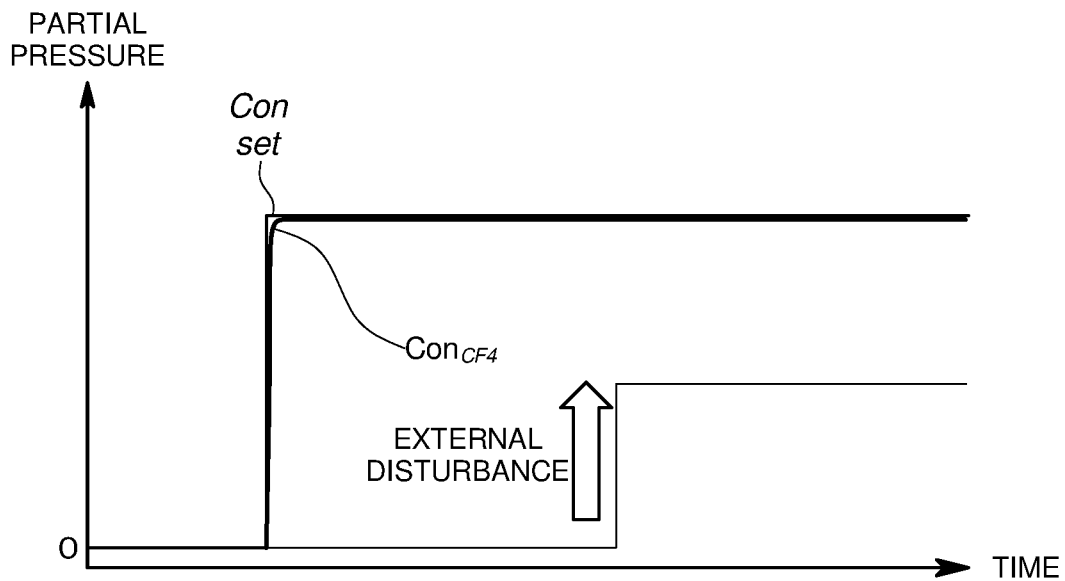
FIG. 7 contains examples of pole designs in the observer control of the same embodiment.
Figure 7:
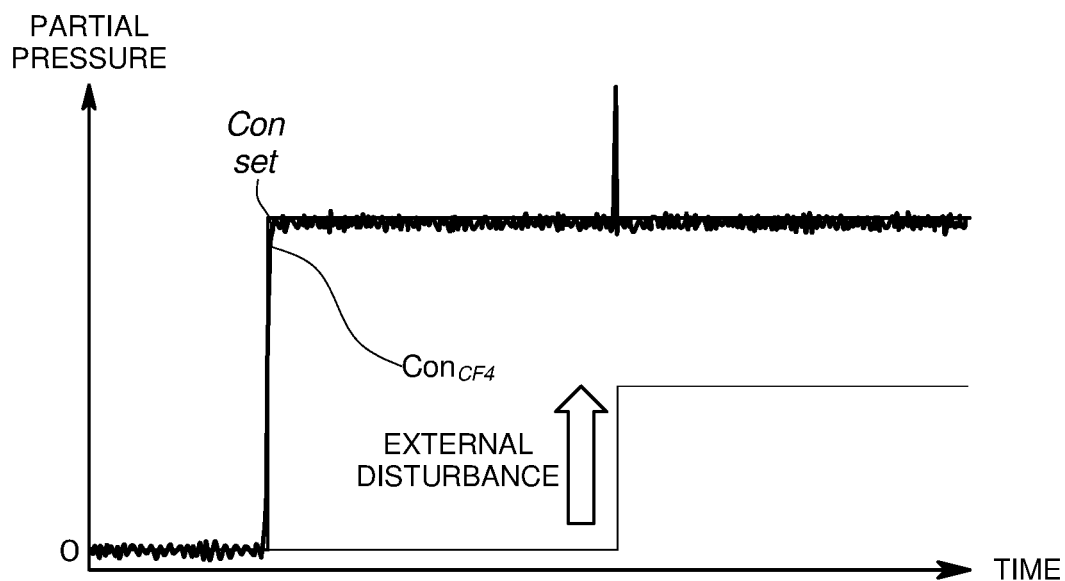

An example in which control by pole placement is designed based on Equation 3 is shown in FIG. 7. Simulation results of response waveforms are compared between a case in which observer control was performed for the partial pressure of $CF_4$ gas within the chamber CN in a case in which [f1; f2; −g]=[−100; −20; −2], and a case in which an antiderivative is inserted into the output and filtering is performed, as per the conventional technology. In the case of the observer control, it was found that not only are the effects of noise eliminated, but the speed of the partial pressure response can be improved. Moreover, even if an external disturbance is generated, robustness is improved so that no effects from such an external disturbance are generated.

In this way, in the concentration control system 100 of the present embodiment, because observer control is performed such that an estimated partial pressure of $CF_4$ gas within the chamber CN, which is not able to be observed by the observer 3, is obtained, and this estimated partial pressure follows the set pressure, it is possible to increase response speed, compensate for any deviation in the external disturbance offset, and reduce noise. Accordingly, it is possible to control the partial pressure of a gas within the chamber CN to a desired value both more accurately than when the conventional technology is used, and without any time delay.

Additional embodiments will now be described.

In the above-described embodiment, a control system is configured that enables state feedback to be performed on the partial pressure of the $CF_4$ gas, however, it is also possible, for example, to configure a control system that enables state feedback to be performed on the partial pressure of, for example, $N_2$ gas as well.

In addition, it is also possible to construct a model of an observer in which the valve opening of the exhaust valve is not fixed, but the conductance is defined as a function of the full pressure and the valve opening.

In a case in which a relationship between the measurement partial pressure from a partial pressure measurement device and the unobservable, actual partial pressure is modeled, this modeling is not limited to modeling for a first order delay, as is the case in the above-described embodiment. It is also possible to perform various other types of modeling such as, for example, modeling for a secondary delay.

As far as the supply flow paths are concerned, the number of branch flow paths is not limited to two, and it is also possible for three or more branch flow paths to be provided. In this case, for the observer model as well, a simulation may be made with the partial pressure within the chamber being made to correspond to the observer model from the flow rate of the gas supplied from each branch flow path.

The measurement principle on which the partial pressure measurement device is based is not limited to light absorbance. It is also possible for a partial pressure measurement device based on another measurement principle, such as an ultrasonic wave concentration sensor, to be used.

Furthermore, it should be understood that the present invention is not limited to the above-described embodiment, and that various modifications and the like may be made thereto insofar as they do not depart from the spirit or scope of the present invention.

DESCRIPTION OF THE REFERENCE CHARACTERS

100 . . . Concentration Control System
1 . . . Flow Rate Control Device
2 . . . Partial Pressure Measurement Device
3 . . . Observer
4 . . . Controller
11 . . . First Flow Rate Control Device
12 . . . Second Flow Rate Control Device
31 . . . Model
32 . . . Observer Gain
CN . . . Chamber
COM . . . Control Calculation Device
EL . . . Exhaust Flow Path
EV . . . Exhaust Valve
DL1 . . . First Branch Flow Path
DL2 . . . Second Branch Flow Path
VP . . . Vacuum Pump

What is claimed is:

1. A concentration control system comprising:
a flow rate control device that is provided on a supply flow path that supplies gas to an interior of a chamber, and performs control such that a flow rate of a gas flowing through this supply flow path matches a set flow rate that has been input;
a partial pressure measurement device that measures a partial pressure of a gas inside the chamber;
an observer that is equipped with a model which estimates a state of the gas inside the chamber, and that is formed such that an inflow flow rate of a gas flowing into the chamber and measurement partial pressures from the partial pressure measurement device are input into the model, and an estimated partial pressure of the gas within the chamber is output; and
a controller that, based on a set partial pressure and on the estimated partial pressure of the gas within the chamber output by the observer, sets the set flow rate in the flow rate control device.

2. The concentration control system according to claim 1, wherein
the model simulates a conductance of an exhaust flow path that expels gas from within the chamber, and the conductance is set to a constant value.

3. The concentration control system according to claim 2, wherein
an exhaust valve whose valve opening is able to be controlled is provided on the exhaust flow path, and the exhaust valve is fixed at a predetermined valve opening.

4. The concentration control system according to claim 2, wherein the estimated partial pressure is a column vector formed by:
- a first estimated partial pressure obtained by estimating the actual partial pressure; and
- a second estimated partial pressure obtained by estimating the measurement partial pressure from the partial pressure measurement device, and wherein
- the observer is further equipped with an observer gain H which is a row vector whose elements are h1 and h2, and
- the element h2 is set to the same value as the conductance.

5. The concentration control system according to claim 1, wherein the partial pressure measurement device is an NDIR analyzer, and
- the model simulates a delay in the measurement partial pressure output by the NDIR analyzer relative to the actual partial pressure as a first order delay.

6. The concentration control system according to claim 1, wherein
- the estimated partial pressure is a row vector formed by:
- a first estimated partial pressure obtained by estimating the actual partial pressure; and
- a second estimated partial pressure obtained by estimating the measurement partial pressure from the partial pressure measurement device, and wherein
- the controller is formed such that deviations between the set partial pressure and the first estimated partial pressure are integrated.

7. A concentration control method that utilizes a concentration control system that comprises a flow rate control device that is provided on a supply flow path that supplies gas to an interior of a chamber, and performs control such that a flow rate of a gas flowing through this supply flow path matches a set flow rate that has been input, and a partial pressure measurement device that measures a partial pressure of a gas inside the chamber, in which
- an inflow flow rate of a gas flowing into the chamber and a measurement partial pressure from the partial pressure measurement device are input into a model which estimates a state of the gas inside the chamber, and an estimated partial pressure of the gas within the chamber is estimated, and in which,
- based on a set partial pressure and on the estimated partial pressure of the gas that has been estimated, the set flow rate is set in the flow rate control device.

8. A program recording medium on which is recorded a program that is used in a concentration control system comprising:
- a flow rate control device that is provided on a supply flow path that supplies gas to an interior of a chamber, and performs control such that a flow rate of a gas flowing through this supply flow path matches a set flow rate that has been input; and
- a partial pressure measurement device that measures a partial pressure of a gas inside the chamber, and that is characterized in causing a computer to perform functions of:
- an observer that is equipped with a model which estimates a state of the gas within the chamber, and that is formed such that an inflow flow rate of a gas flowing into the chamber and a measurement partial pressure from the partial pressure measurement device are input into the model, and an estimated partial pressure of the gas within the chamber is output; and of
- a controller that, based on a set partial pressure and on the estimated partial pressure of the gas within the chamber output by the observer, sets the set flow rate in the flow rate control device.

* * * * *